United States Patent [19]

Park

[11] Patent Number: 5,527,725
[45] Date of Patent: Jun. 18, 1996

[54] METHOD FOR FABRICATING A METAL OXIDE SEMICONDUCTOR FIELD EFFECT TRANSISTOR

[75] Inventor: Sang H. Park, Kyoungki-do, Rep. of Korea

[73] Assignee: Hyundai Electronics Industries Co., Ltd., Kyoungki-do, Rep. of Korea

[21] Appl. No.: 364,166

[22] Filed: Dec. 27, 1994

[30] Foreign Application Priority Data

Dec. 28, 1993 [KR] Rep. of Korea ........................ 93-30480

[51] Int. Cl.$^6$ ............................................. H01L 21/8234
[52] U.S. Cl. .................... 437/41; 437/35; 437/44
[58] Field of Search ................................. 437/43, 40 GS, 437/41 GS, 35, 913, 40 R, 41 R, 44, 41 RLD

[56] References Cited

U.S. PATENT DOCUMENTS

| | | | |
|---|---|---|---|
| 5,089,432 | 2/1992 | Yoo | 437/41 GS |
| 5,177,027 | 1/1993 | Lowrey et al. | 437/41 AS |
| 5,262,337 | 11/1993 | Kim | 437/41 GS |
| 5,403,763 | 4/1995 | Yamazaki | 437/35 |
| 5,407,848 | 4/1995 | Park et al. | 437/35 |

FOREIGN PATENT DOCUMENTS 3-190140   8/1991   Japan ........................ 437/35

*Primary Examiner*—Tom Thomas
*Assistant Examiner*—Michael Trinh
*Attorney, Agent, or Firm*—Morgan & Finnegan

[57] ABSTRACT

A metal oxide semiconductor field effect transistor having an increased channel length in a limited area of a highly integrated chip where a gate electrode is formed, and a method for fabricating the transistor. The transistor includes a semiconductor substrate having a protruded structure at a predetermined portion thereof, a gate oxide film surrounding the protruded structure of the semiconductor substrate, a polysilicon layer pattern for a gate electrode, the polysilicon layer pattern disposed over the gate oxide film, lightly doped drain regions formed in the semiconductor substrate respectively at opposite edges of the polysilicon layer pattern, and source and drain regions formed outward of the lightly doped drain regions in the semiconductor substrate respectively.

4 Claims, 3 Drawing Sheets

5,527,725

METHOD FOR FABRICATING A METAL OXIDE SEMICONDUCTOR FIELD EFFECT TRANSISTOR

BACKGROUND OF THE INVENTION

1. Field of the Invention

The present invention relates to a metal oxide semiconductor field effect transistor (MOSFET) and a method for fabricating the same, and more particularly to a MOSFET having a self-aligned polycide structure with an increased channel length and a method for fabricating the MOSFET.

2. Description of the Prior Art

As a semiconductor device such as a MOSFET has a higher integration degree, the gate channel length thereof is reduced.

Referring to FIG. 1, there is illustrated a MOSFET fabricated in accordance with the prior art. The MOSFET shown in FIG. 1 is fabricated in the following manner. That is, a gate oxide film 2 and a gate electrode 3 made of a polysilicon layer are formed on a silicon substrate 1. Impurity ions are then implanted in a low concentration in the silicon substrate 1 so as to form lightly doped drain (LDD) regions. On side walls of the gate electrode 3, spacers 5 are then formed, respectively. Thereafter, impurity ions are implanted in a high concentration in the silicon substrate 1, thereby forming source/drain regions 6.

In this MOSFET, the channel length is reduced as the integration degree is increased. Where the channel length is reduced, the threshold voltage $V_t$ and the breakdown voltage $V_{BD}$ are reduced. The reduced channel length also results in an increased flow of current in the substrate. As a result, the electrical characteristic of the MOSFET is degraded.

SUMMARY OF THE INVENTION

Therefore, an object of the present invention is to provide a MOSFET having an increased channel length in a limited area of a highly integrated chip where a gate electrode is formed, and a method for fabricating the MOSFET.

In accordance with one aspect, the present invention provides a method for fabricating a metal oxide semiconductor field effect transistor, comprising the steps of: forming a first oxide film over a semiconductor substrate, forming a photoresist film pattern on the first oxide film, and then etching an exposed portion of the first oxide film and a portion of the semiconductor substrate disposed beneath the exposed portion of the first oxide film to a predetermined depth, thereby forming a protruded structure of the semiconductor substrate; removing the photoresist film pattern and the first oxide film, and then forming a gate oxide film and a polysilicon layer over the entire exposed surface of the resulting structure obtained after the removal of the first oxide film; removing a predetermined portion of the polysilicon layer by use of an etching process using a gate electrode mask, thereby forming a gate electrode having a structure surrounding the protruded structure of the semiconductor substrate; implanting impurity ions in a low concentration in the semiconductor substrate, thereby forming lightly doped drain regions; and forming insulating film spacers respectively on side walls of the polysilicon layer patterned, and then implanting impurity ions in a high concentration in the semiconductor substrate, thereby forming source/drain regions.

In accordance with another aspect, the present invention provides a metal oxide semiconductor field effect transistor comprising: a semiconductor substrate having a protruded structure at a predetermined portion thereof; a gate oxide film surrounding the protruded structure of the semiconductor substrate; a polysilicon layer pattern for a gate electrode, the polysilicon layer pattern disposed over the gate oxide film; lightly doped drain regions formed in the semiconductor substrate respectively at opposite edges of the polysilicon layer pattern; and source and drain regions formed outward of the lightly doped drain regions in the semiconductor substrate respectively.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

FIGS. 2A to 2D illustrate a MOSFET having a structure with an increased channel length in a limited area in accordance with the present invention, respectively.

Figure 1:
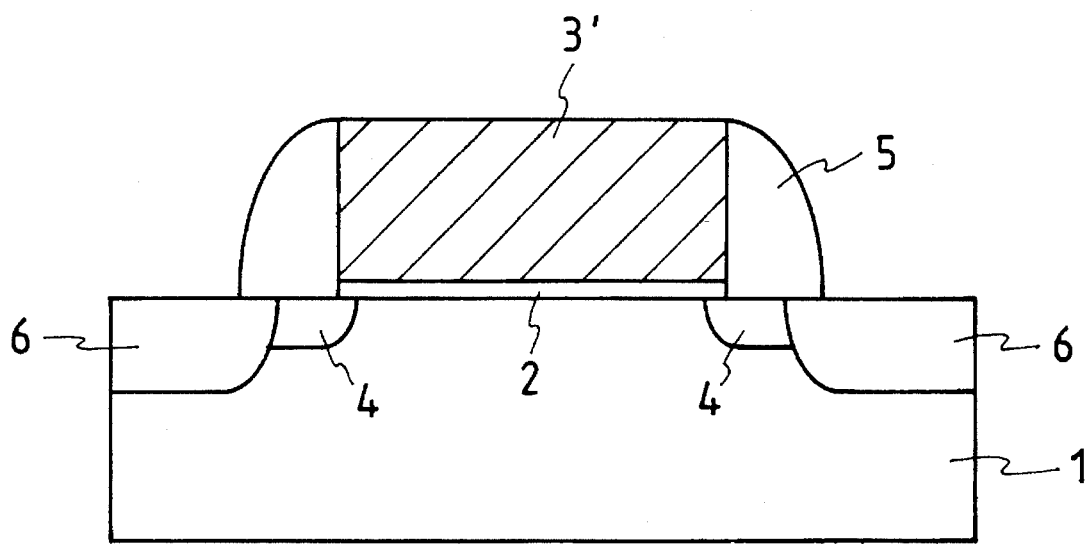
FIG. 1 is a sectional view illustrating a MOSFET fabricated in accordance with the prior art.
Figure 2A:
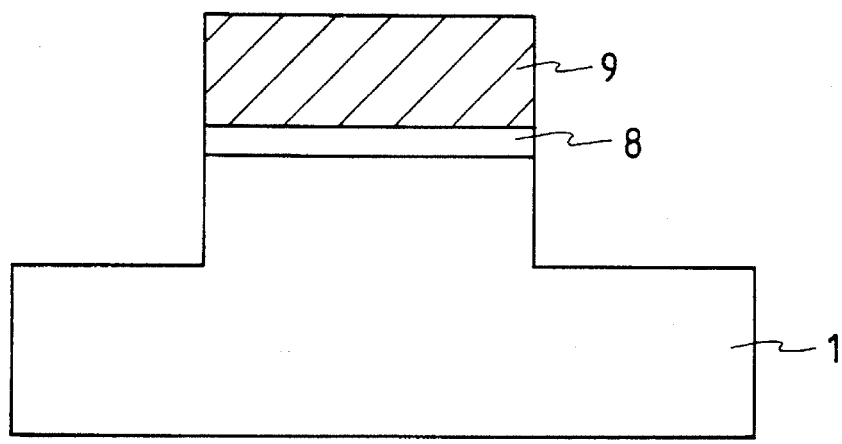
FIGS. 2A to 2D are sectional views respectively illustrating a MOSFET having a structure with an increased channel length in a limited area in accordance with the present invention.

In accordance with the present invention, the MOSFET is fabricated in the following manner. That is, a first oxide film 8 is formed to a thickness of 100 to 500 Å over a silicon substrate 1, as shown in FIG. 2A. Over the first oxide film 8, a photoresist film pattern 9 is then formed. Using the photoresist film pattern 9, the first oxide film 8 and the silicon substrate 1 disposed beneath the first oxide film 8 are subjected to an etching process. By the etching process, the silicon substrate 1 is partially etched to a predetermined depth, thereby forming a protruded structure thereof.

Figure 2B:
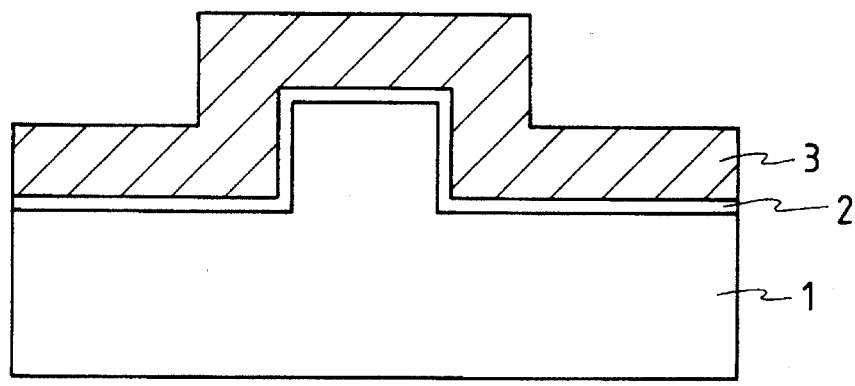

Thereafter, the photoresist film pattern 9 is removed. The first oxide film 8 exposed after the removal of the photoresist film pattern 9 is then removed by use of HF. Over the entire exposed surface of the resulting structure, a gate oxide film 2 and a dope polysilicon layer 3 are then formed, as shown in FIG. 2B. Impurity ions for controlling the threshold voltage $V_t$ may be implanted in the silicon substrate 1 after the removal of the first oxide film 8.

Figure 2C:
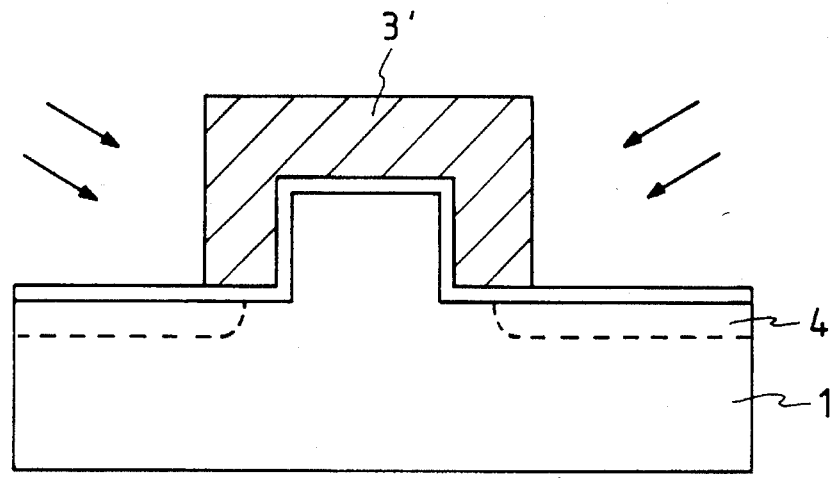

Subsequently, a predetermined portion of the polysilicon is etched by an etching process using a photoresist film (not shown) for a gate electrode mask, thereby forming a gate electrode 3' having a structure surrounding the protruded portion of the silicon substrate 1, as shown in FIG. 2C. Impurity ions are then slantly implanted in a low concentration in the silicon substrate 1 so as to form LDD regions 4.

Figure 2D:
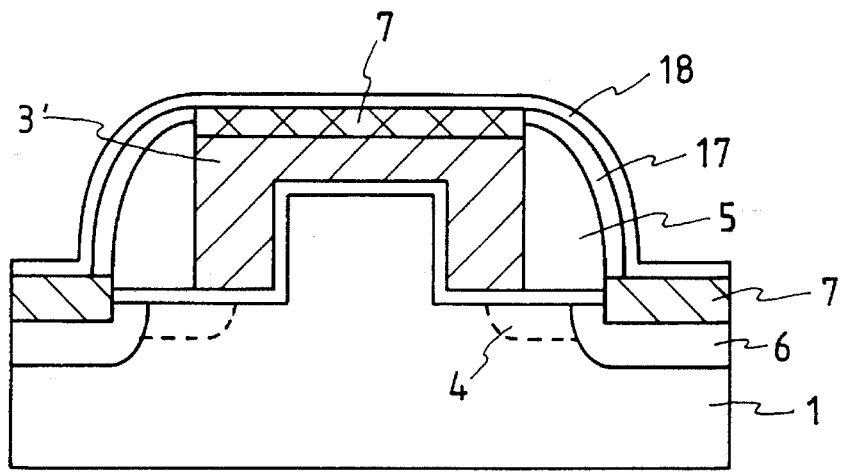

Insulating film spacers 5 are then formed on side walls of the gate electrode 3', respectively, as shown in FIG. 2D. Thereafter, impurity ions are implanted in a high concentration in the silicon substrate 1, thereby forming source/drain regions 6. Over the entire exposed surface of the resulting structure, a transition metal (not shown) layer and a second oxide film 18 are then coated. The resulting structure is then subjected to annealing so that silicide layers 7 are formed on the gate electrode 3' and the source/drain regions 6, respectively. By the annealing, the transition metal layer is also oxidized, thereby forming a transition metal oxide film 17.

As apparent from the above description, the effective channel length is increased correspondingly to an increase in integration degree of the MOSFET. In accordance with the present invention, an improved insulating effect is also obtained by virtue of the silicide layers respectively formed on the gate electrode and the source/drain and the transition metal oxide film formed by oxidizing the transition metal film deposited on each insulating film spacer.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a metal oxide semiconductor field effect transistor, comprising the steps of:

forming a first oxide film over a semiconductor substrate, forming a photoresist film pattern on the first oxide film, and then etching an exposed portion of the first oxide film and a portion of the semiconductor substrate disposed beneath the exposed portion of the first oxide film to a depth, thereby forming a protruded structure of the semiconductor substrate;

removing the photoresist film pattern and the first oxide film, and then forming a gate oxide film and a polysilicon layer over an entire exposed surface of a resulting structure obtained after the removal of the first oxide film;

removing a portion of the polysilicon layer by use of an etching process using a gate electrode mask, thereby forming a gate electrode having a structure surrounding the protruded structure of the semiconductor substrate;

implanting impurity ions in a low concentration in the semiconductor substrate, thereby forming lightly doped drain regions; at opposite edges of the gate electrode; and forming insulating film spacers respectively on side walls of the gate electrode, and then implanting impurity ions in a high concentration in the semiconductor substrate, thereby forming source/and drain regions.

2. A method in accordance with claim 1, wherein the impurity ions of low concentration are implanted slantly with respect to the semiconductor substrate.

3. A method in accordance with claim 1, further comprising the step of implanting impurity ions for a threshold voltage control in the semiconductor substrate prior to the formation of the gate oxide film.

4. A method in accordance with claim 1, further comprising the step of coating a transition metal film and a second oxide film over an entire exposed surface of a resulting structure obtained after the formation of the source/and drain regions, subjecting the resulting structure obtained after the coating of the second oxide film to annealing to form silicide layers respectively on the gate electrode and the source/and drain regions, and then oxidizing remaining portions of the transition metal film, thereby forming a transition metal oxide film.

\* \* \* \* \*